United States Patent
Dubin et al.

(10) Patent No.: US 6,432,821 B1
(45) Date of Patent: Aug. 13, 2002

(54) METHOD OF COPPER ELECTROPLATING

(75) Inventors: Valery M. Dubin, Portland; Dave W. Jentz, Hillsboro; Christopher Collazo-Davila, Aloha, all of OR (US)

(73) Assignee: Intel Corporation, Santa Clara, CA (US)

( * ) Notice: Subject to any disclaimer, the term of this patent is extended or adjusted under 35 U.S.C. 154(b) by 36 days.

(21) Appl. No.: 09/739,930

(22) Filed: Dec. 18, 2000

(51) Int. Cl.$^7$ ................................. H01L 21/44
(52) U.S. Cl. ................. 438/678; 438/679; 438/687
(58) Field of Search ......................... 438/678, 679, 438/687

(56) References Cited

U.S. PATENT DOCUMENTS

| | | | |
|---|---|---|---|
| 6,245,676 B1 | * 6/2001 | Ueno | 438/687 |
| 6,297,157 B1 | * 10/2001 | Lopatin et al. | 438/687 |
| 6,340,633 B1 | * 1/2002 | Lopatin et al. | 438/678 |
| 2002/0004301 A1 | * 1/2002 | Chen et al. | 438/687 |
| 2002/0022363 A1 | * 2/2002 | Ritzdorf et al. | 438/687 |

* cited by examiner

Primary Examiner—John F. Niebling
Assistant Examiner—Lynne A. Gurley
(74) Attorney, Agent, or Firm—Blakely, Sokoloff, Taylor & Zafman LLP

(57) ABSTRACT

An electroplating process for filling damascene structures on substrates, such as wafers having partially fabricated integrated circuits thereon, includes immersing a substrate, under bias, into a copper plating solution to eliminate thin seed layer dissolution and reduce copper oxide, an initiation step to repair discontinuities in a copper seed layer, superfill plating to fill the smallest features, reverse plating to remove the adsorbed plating additives and their by-products from the substrate, a second superfill plating to fill intermediate size features, a second reverse plating to remove adsorbed plating additives and their by-products from the substrate, and a bulk fill plating with high current density to fill large features. The superfill and reverse plating operations may be repeated more than twice prior to bulk filling in order to provide the desired surface morphology.

31 Claims, 5 Drawing Sheets

METHOD OF COPPER ELECTROPLATING

BACKGROUND OF THE INVENTION

1. Field of the Invention

The present invention relates generally to the field of electroplating, and more specifically, to electroplating of copper onto wafers to fill damascene structures.

2. Background

Advances in semiconductor manufacturing technology have led to the development of integrated circuits having multiple levels of interconnect. In such an integrated circuit, patterned conductive material on one interconnect level is electrically insulated from patterned conductive material on another interconnect level by films of material such as, for example, silicon dioxide. These conductive materials are typically a metal or metal alloy. Connections between the conductive material at the various interconnect levels are made by forming openings in the insulating layers and providing an electrically conductive structure such that the patterned conductive material from different interconnect levels are brought into electrical contact with each other. These electrically conductive structures are often referred to as contacts or vias.

Other advances in semiconductor manufacturing technology, such as the ability to repeatably pattern very small features, have led to the integration of millions of transistors, each capable of switching at high speed. A consequence of incorporating so many fast switching transistors into an integrated circuit is an increase in power consumption during operation. One technique for increasing speed while reducing power consumption is to replace the traditional aluminum and aluminum alloy interconnects found on integrated circuits with a metal such as copper, which offers lower electrical resistance. Those skilled in the electrical arts will appreciate that by reducing resistance, electrical signals may propagate more quickly through the interconnect pathways on an integrated circuit. Furthermore, because the resistance of copper is significantly less than that of aluminum, the cross-sectional area of a copper interconnect line, as compared to an aluminum interconnect line, may be made smaller without incurring increased signal propagation delays based on the resistance of the interconnect. Additionally, because the capacitance between two electrical nodes is a function of the overlap area between those nodes, using a smaller copper interconnect line results in a decrease in parasitic capacitance. In this way, replacing aluminum-based interconnects with copper-based interconnects provides, depending on the dimensions chosen, reduced resistance, reduced capacitance, or both.

As noted above, copper has electrical advantages, such as lower resistance per cross-sectional area, the ability to provide for reduced parasitic capacitance, and greater immunity to electromigration. For all these reasons manufacturers of integrated circuits find it desirable to include copper in their products.

While advantageous electrically, copper is difficult to integrate into the process of making integrated circuits. As is known in this field, copper can adversely affect the performance of metal oxide semiconductor (MOS) field effect transistors (FETs) if the copper is allowed to migrate, or diffuse, into the transistor areas of an integrated circuit. Therefore copper diffusion barriers are used to isolate copper metal from those transistor areas. Additionally, unlike aluminum based metal interconnect systems which are formed by subtractive etch processes, copper interconnects are typically formed by damascene metal processes. Such processes are also sometimes referred to as inlaid metal processes.

In a damascene process, trenches are formed in a first layer, and a metal layer is formed over the first layer including the trenches. Excess metal is then polished off leaving individual interconnect lines in the trenches. FIG. 1 shows a schematic cross-section of a partially processed wafer with a postplating, pre-polish damascene structure 100. In this case, a dual damascene structure has been formed with a trench portion 108 and a via portion 110. Trench 108 and via 110 are formed by first patterning, i.e., making openings in, interlayer dielectric 102. A layer 104 that acts as a barrier to copper diffusion is then formed over the surfaces of patterned interlayer dielectric 102, a seed layer is formed over barrier layer 104, and copper or copper alloy is plated over these.

Accordingly, there is a need for electroplating methods, materials, and apparatus to that can form, on wafers, very narrow conductive interconnects made from materials such as copper and copper alloys.

DETAILED DESCRIPTION

Figure 1:
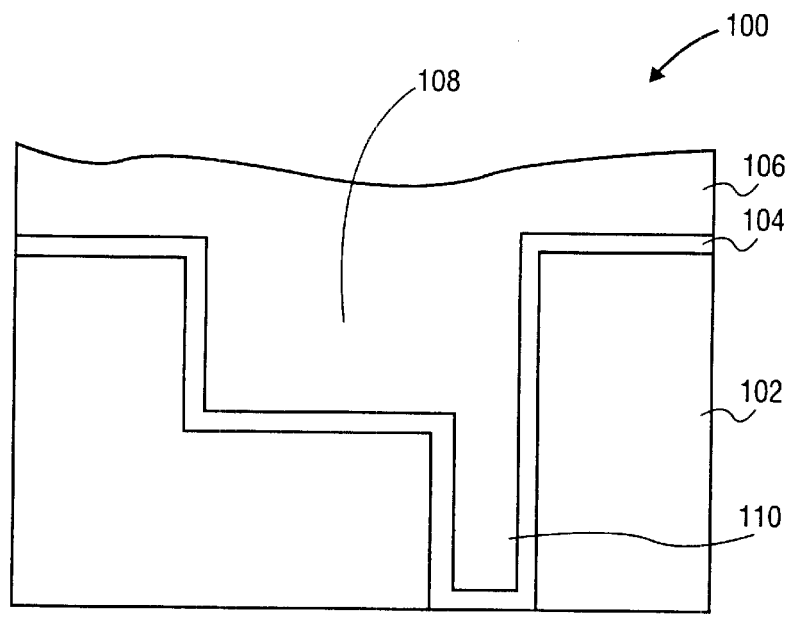
FIG. 1 is a schematic cross-sectional view of a copper damascene structure. This structure represents a post-plating, pre-polishing state of fabrication.

Methods of copper electroplating are described. In the following description numerous specific details are set forth to provide an understanding of the present invention. It will be apparent, however, to those skilled in the art and having the benefit of this disclosure, that the present invention may be practiced with apparatus and processes that vary from those specified herein.

Reference herein to "one embodiment", "an embodiment", or similar formulations, means that a particular feature, structure, or characteristic described in connection with the embodiment is included in at least one embodiment of the present invention. Thus, the appearances of such phrases or formulations herein are not necessarily all referring to the same embodiment. Furthermore, various particular features, structures, or characteristics may be combined in any suitable manner in one or more embodiments.

Terminology

The terms, chip, integrated circuit, monolithic device, semiconductor device or component, microelectronic device or component, and similar terms and expressions, are often used interchangeably in this field. The present invention is applicable to all the above as they are generally understood in the field.

The terms metal line, trace, wire, conductor, signal path and signaling medium are all related. The related terms listed above, are generally interchangeable, and appear in order from specific to general. In this field, metal lines are sometimes referred to as traces, wires, lines, interconnects or simply metal.

The terms contact and via, both refer to structures for electrical connection of conductors from different interconnect levels. These terms are sometimes used in the art to describe both an opening in an insulator in which the structure will be completed, and the completed structure itself. For purposes of this disclosure contact and via refer to the completed structure.

Dishing, as used herein, refers to the amount of material, typically the metal of a metal damascene structure, that is removed during the polishing of the metal damascene structure. Dishing is measured as a thickness, or distance, and more particularly, it is a measure of the distance between the post-polish surface of the interlayer dielectric and the post-polish surface of the metal. Dishing typically occurs in metal structures that are wider than the minimum metal width permitted in a given set of design rules.

Erosion, as used herein, refers to the amount of a layer, typically an interlayer dielectric, that is removed during the polishing of a metal damascene structure. Erosion is measured as a thickness, or distance, and more particularly, it is a measure of the distance between the original surface of the layer and its post-polish surface. Erosion is generally an undesirable result of overpolishing.

As used herein the terms forward current and cathode current are used interchangeably. Also the terms reverse current and anode current are used interchangeably. With respect to the forward and reverse currents, the expression forcing a current is used interchangeably with applying a voltage, since it is the application of the voltage which drives the current flow.

Inventors: [pls Confirm that these definitions are OK]

The term vertical, as used herein, means substantially perpendicular to the surface of a substrate.

In conventional copper plating processes, single or dual damascene structures are filled by using direct current (DC) plating. However, DC plating tends to result in undesirable "hump" development over small features (e.g., less than 1 micron). Such humps may have a step height of, for example, more than 0.5 microns when the target plated thickness is 1.0 micron. The uneven surface morphology presented by these humps leads to overpolishing in a subsequent chemical mechanical polishing operation. In turn, overpolishing adversely affects the integrated circuits being manufactured by increasing dishing and erosion.

Another undesirable aspect of conventional DC copper electroplating processes, is the high within wafer non-uniformity (>3.5%, 1 sigma) due to the "center thick spot" phenomenon. This center thick spot is caused by a high flow rate and a higher concentration of accelerator at the center of the wafer in the so-called fountain plating process (which includes a center flow nozzle). Accelerators may include one or more organic additives in the plating solution. Sulfopropyl disulfide (SPS) and mercaptopropanesulfonic acid (MPS) are examples of additives or by-products that may be found in a copper electroplating solution.

Electroplating by means of an alternating current (AC) process has been disclosed in the this field. However, these conventional AC electroplating processes have been found to have problems in terms of deposition morphology, as well as consumption of organic additives.

FIGS. 2–6 illustrate some of the known conventional plating programs. It is noted that the current versus time plating program figures herein, are not all drawn to the same scale, but are merely designed to illustrate, relative times and currents for each such plating program.

Figure 2:
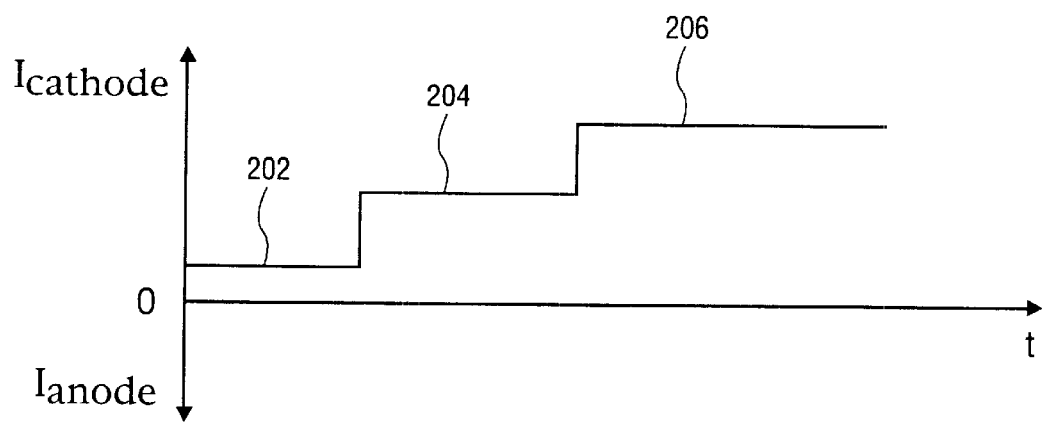
FIG. 2 is a graph showing cathode and anode currents as a function of time in a conventional electroplating process.

FIG. 2 shows a plating program in which an initiation, or seed layer repair, operation is performed by forcing a first forward current 202. A second forward current 204 is then forced to superfill features less than 0.3 microns in width. Finally, a third forward current 204 is forced to perform a bulk fill operation. Forward current 204 has a density less than 30 mA/cm$^2$.

Figure 3:
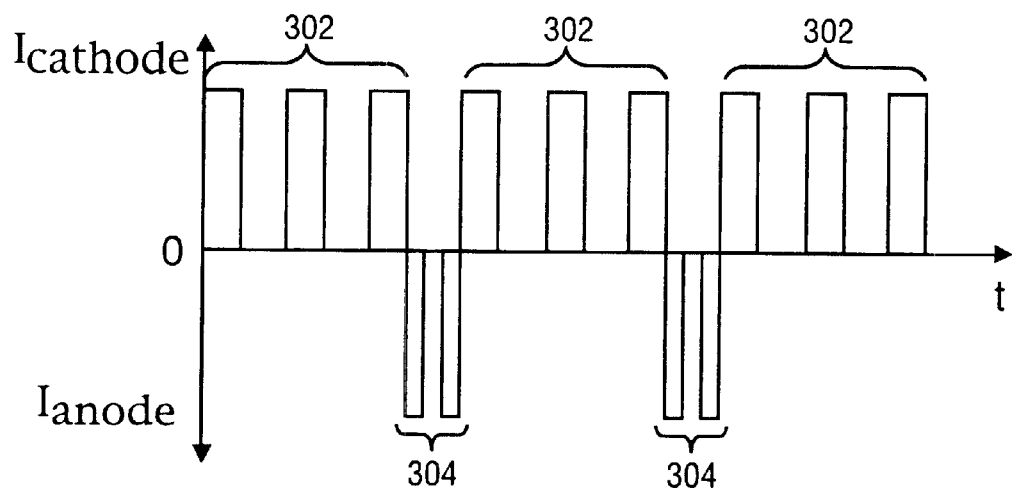
FIG. 3 is a graph showing cathode and anode currents as a function of time in a conventional electroplating process.

FIG. 3 shows a conventional plating program combining forward and reverse current pulses. More particularly, FIG. 3 shows a first pattern 302 which includes three forward current pulses, each separated from the other by a period of zero current. The width (in time) of the pulses in first pattern 302 range from 1 ms to 100 ms. FIG. 3 also shows a second pattern 304 which includes two reverse current pulses separated from each other by a period of zero current. The pulse width of the second pattern pulses ranges between 1 ms and 100 ms. As shown in FIG. 3, a first pattern set of pulses is followed by a second pattern set of pulses, and so on, with the patterns alternating.

Figure 4:
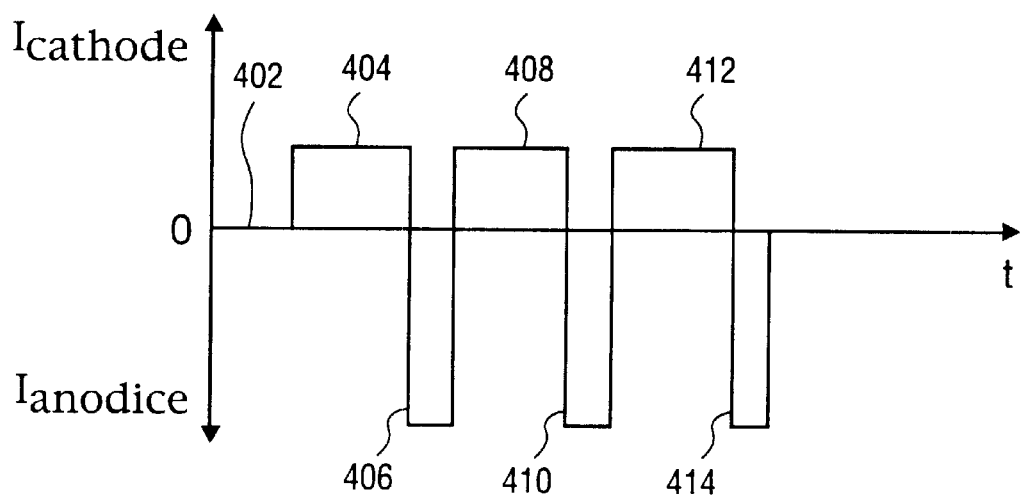
FIG. 4 is a graph showing cathode and anode currents as a function of time in a conventional electroplating process.

FIG. 4 shows a conventional plating program combining forward and reverse current pulses. FIG. 4 begins with the wafer in a plating bath with zero current being forced 402. Forward current pulses 404, 408, 414 each occur immediately after forward current pulses 404, 408, and 412 respectively. This bi-polar pattern of current pulses uses high intensity, short duration anodic currents to increase Cu dissolution at the neck of a feature, relative to the base. Those features being formed in the interlayer dielectric (e.g., a via opening or a trench).

Figure 5:
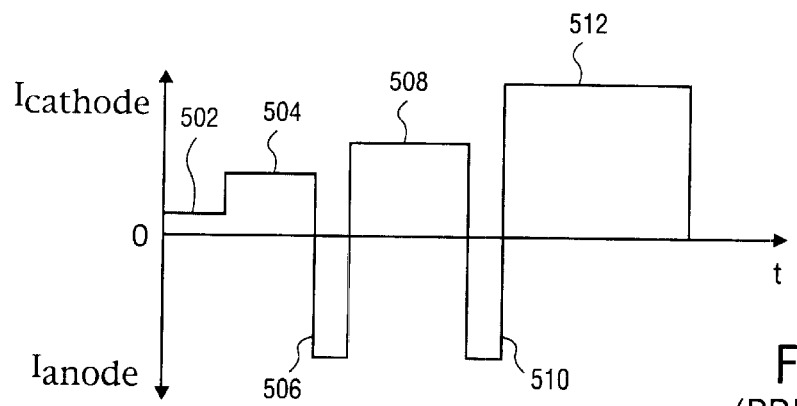
FIG. 5 is a graph showing cathode and anode currents as a function of time in a conventional electroplating process.

FIG. 5 shows a conventional plating program, for 200 mm wafers, combining forward and reverse pulses with an increasing pattern of forward current magnitude. More particularly, forward current step 502 is 3.6 mA/cm$^2$, forward current step 504 is 10.9 mA/cm$^2$, reverse current step 506 is 21.8 mA/cm$^2$, forward current step 508 is 14.5 mA/cm$^2$, reverse current step 510 is 21.8 mA/m$^2$, and forward current step 512 is 65.4 mA/cm$^2$. The plating program of FIG. 5 is characterized by short pulse widths and high current densities.

Figure 6:
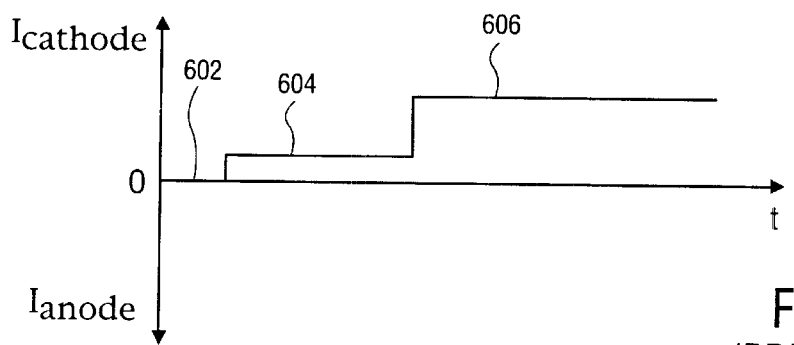
FIG. 6 is a graph showing cathode and anode currents as a function of time in a conventional electroplating process.

FIG. 6 shows a conventional plating program which uses a two-step DC plating scheme. In this scheme a zero current induction time 602 is provided, followed by a low DC current 604, and followed in turn by a high current bulk filling step 606.

In an embodiment of the present invention, a damascene structure is filled with a conductive material such as copper. Individual interconnect lines are subsequently formed as excess portions of the copper or copper alloy, and any excess conductive barrier layer material are removed. As described more fully below, an illustrative method in accordance with the present invention follows a seven stage electroplating process. Processes embodying the present invention may use (2n+1) electroplating stages, wherein n=1 to 5.

Vias and trenches are first formed in a dielectric layer. This is typically the first part of a damascene process. Organic, inorganic, or a combination of organic and inorganic materials may be used to form the interlayer dielectric (ILD). A copper diffusion barrier is then typically formed over the surfaces of the ILD, including the top surfaces of the ILD and the surfaces of the vertical sidewalls of the trenches and vias. The diffusion barrier may be formed by processes such as, but not limited to, physical vapor deposition (PVD), ionized physical vapor deposition (iPVD), chemical vapor deposition (CVD), or atomic layer deposition (ALD). The diffusion barrier may be formed of Ta, TaN, W, WN, TiN, TaSiN, Mo, MoN, MoSiN, Nb, NbN, NbSiN, and other refractory metals and their alloys.

Figure 7:
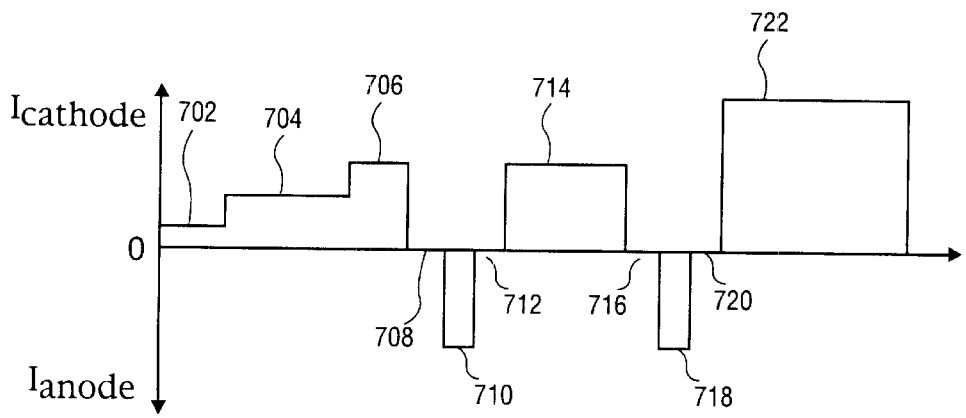
FIG. 7 is a graph showing cathode and anode currents as a function of time in an electroplating process in accordance with the present invention.

A process for filling damascene trenches and vias by a multi-step copper electroplating method in accordance with the present invention includes, immersing a wafer under bias into a plating solution; and as indicated in FIG. 7, performing a superfill plating operation; performing reverse plating operation, performing a second superfill operation and a second reverse plating operation; and subsequently performing a bulk fill operation with a high current density.

Referring now to FIG. 7, an illustrative embodiment of the present invention is described in more detail. A wafer, under bias, is immersed into a plating solution to reduce or eliminate thin seed layer dissolution and reduce copper oxidation. An initiation, or seed layer repair operation is performed with forward current 702. This is followed by forward currents 704, 706 that perform a superfill operation, also referred to as bottom-up plating. Superfill is used to fill the smallest damascene features, for example, openings less than 0.3 micron. After bringing the system to equilibrium 708, a reverse plating operation is performed to remove adsorbed plating additives and their by-products from the wafer. The reverse plating operation is achieved with reverse current 710. After restoring the system to equilibrium 712, a second superfill operation is performed to fill intermediate size damascene features, for example, openings about 0.3 to 0.6 microns in size. The second superfill operation is achieved with forward current 714. Next, the system is again returned to equilibrium 716, and a second reverse plating operation, achieved with reverse current 718, removes adsorbed plating additives and their by-products from the wafer. Once again the system is returned to equilibrium 720. A high current density bulk fill operation 722 fills large size damascene features, for example, those greater than about 0.6 microns. The superfill and reverse plating steps can be repeated a number of times prior to the bulk fill operation in order to provide the desired surface morphology for chemical mechanical polishing (CMP).

Various embodiments of the present invention may use a number of forward current steps equal to 2n+1, where n typically is in the range of 1 to 5. These forward current steps may be at a current density of 10 to 30 mA/cm$^2$ for a time between 2 and 60 seconds. Forward current steps may include two or more sub-steps. A first sub-step includes plating with lower current density (to build accelerator and Cl diffusion gradients) while the second or subsequent sub-steps include plating at higher current densities (i.e., a bottom-up fill). Before these steps, there is an initiation step at low current density to repair discontinuous portions of the seed layer at current densities between 0.3 and 5 mA/cm$^2$. This initiation step is performed just after the wafer is immersed in the plating bath. The final forward current step is used to fill large features (i.e., greater than 0.6 microns), while the earlier, lower current density, forward current steps are used to fill the smaller features. The reverse current steps may be at a current density of 15 to 60 mA/cm$^2$ with up to 60 Coulombs of passed charge between forward steps. As mentioned above, reverse plating is used to remove adsorbed plating additives and their by-products from the wafer by de-plating copper.

Copper alloys such as CuSn, CuMg, CuNi, CuZn, CuPd, CuAu, CuRe, and CuW can be selectively plated into damascene structures to improve electromigration resistance, corrosion resistance, and form self-passivated barriers on the sidewalls of features and the top of Cu lines due to the diffusion of the alloying elements toward the outer surfaces of the interconnect lines.

Figure 8:
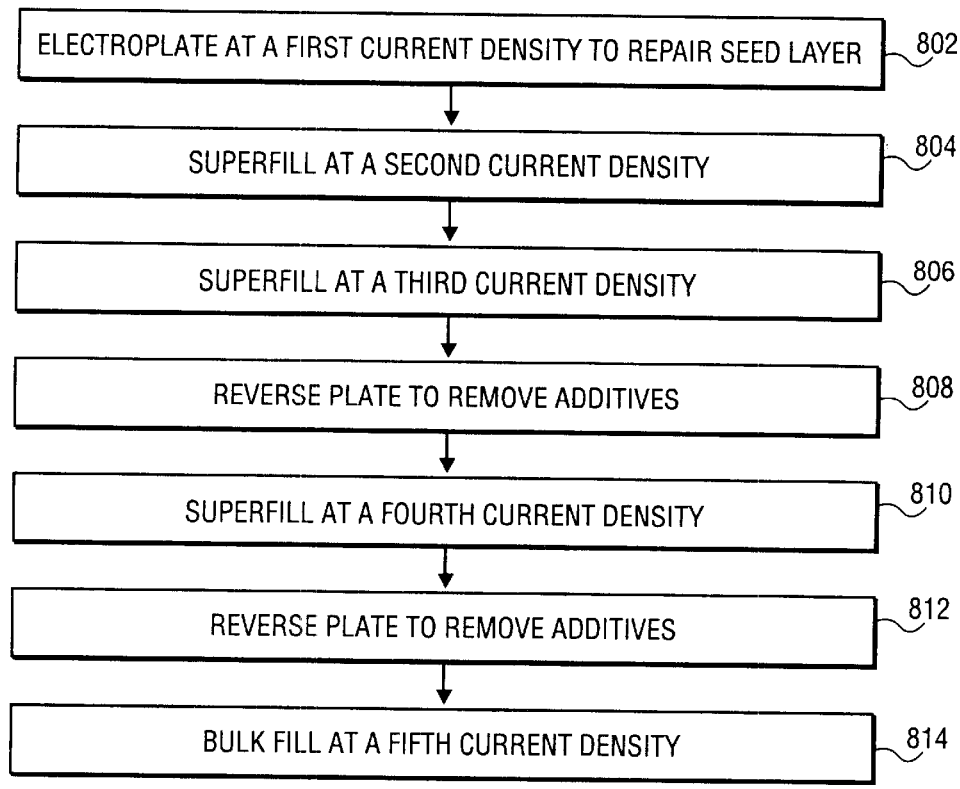
FIG. 8 is a flow diagram of a process in accordance with the present invention.

FIG. 8 is a flow diagram illustrating one embodiment of the present invention. A wafer is electroplated at a first current density to repair the seed layer (802). A superfill operation a second current density and a super fill at a third current density are then performed (804, 806). A reverse plating operation (808) removes additive and by-products from the plated surface. This operation is sometimes referred to as de-plating. Another superfill at a fourth current density (810) is followed by another reverse plating operation (812). Finally a bulk fill operation at a fifth current density (814) is performed. The embodiment of the present invention, by implementing a series of current pulses having a newly discovered range of current magnitudes and pulse widths, provides a reduction in void formation and improved surface morphology.

Figure 9:
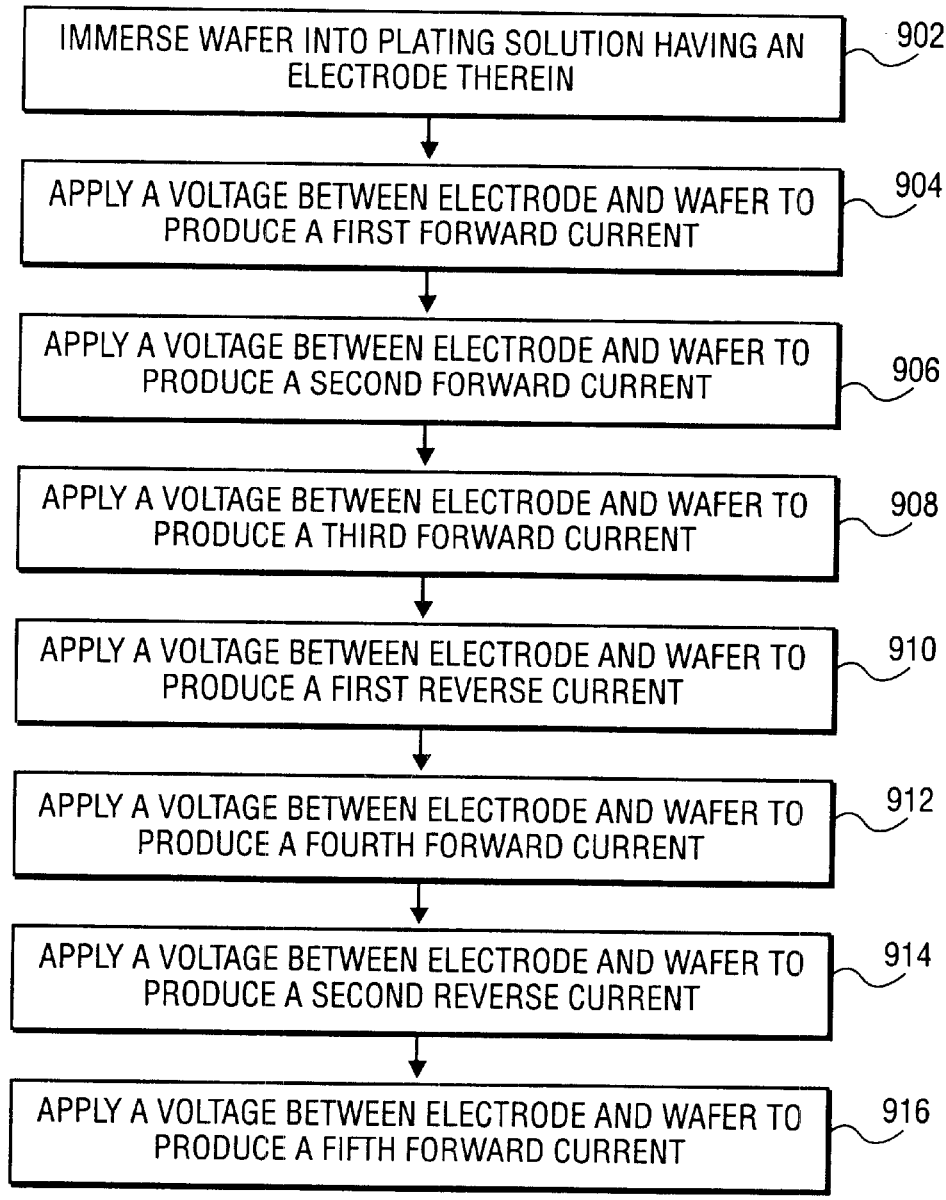
FIG. 9 is a flow diagram of a process in accordance with the present invention.

FIG. 9 is a flow diagram illustrating an embodiment of the present invention. A wafer is immersed into a plating solution having an electrode therein (902). A voltage is applied between the electrode and the wafer to produce a first forward current (904). The applied voltage is changed to produce a second forward current (906), and changed again to provide a third forward current (908). The applied voltage is changed once again to produce a first reverse current (910). The applied voltage is then changed to produce a fourth forward current (912). The applied voltage is then changed to produce a second reverse current (914). Finally, the applied voltage is changed to produce a fifth forward current (916). In this illustrative embodiment, the first and second reverse currents are nominally the same magnitude and between 15 and 60 mA/cm$^2$. The first, second, third, fourth, and fifth forward currents are each different from the other and monotonically increasing in this illustrative embodiment. The magnitudes of the current densities of the first, second, third, and fourth currents is between 10 and 30 mA/cm$^2$ with a duration of between 2 and 60 seconds each.

Conclusion

Embodiments of the present invention provide methods of forming copper and copper alloy interconnects on integrated circuits. These copper and copper alloy interconnects are formed by way of a multi-step electroplating process that includes forward and reverse plating currents. The current densities and length of times for each step of the electroplating operation are chosen so that the process as a whole provides a reduction or elimination of voids when filling small openings in an interlayer dielectric film.

An advantage of some embodiments of the present invention is that within die non-uniformity, measured as a reduction of hump step height over small features, is reduced.

A further advantage of some embodiments of the present invention is that production throughput is increased.

A still further advantage of some embodiments of the present invention is improved gap filling.

A still further advantage of some embodiments of the present invention is that CMP end point detection is improved, while dishing and erosion are reduced.

It will be apparent to those skilled in the art that a number of variations or modifications may be made to the illustrative embodiments described above. For example, various combinations of forward and reverse current densities and durations may be used within the scope of the present invention.

Other modifications from the specifically described apparatus, plating baths, and processes will be apparent to those skilled in the art and having the benefit of this disclosure. Accordingly, it is intended that all such modifications and alterations be considered as within the spirit and scope of the invention as defined by the subjoined claims.

What is claimed is:

1. A method of forming copper interconnect, comprising:
   forming trenches in a dielectric layer disposed on a wafer;
   forming a barrier layer over the trenches and dielectric layer immersing the wafer, under bias, in a plating solution;
   performing a first plating operation at a forward current density between 10 and 30 mA/cm$^2$ and for a duration between 2 and 60 seconds;
   performing a second plating operation at a reverse current density between 15 and 60 mA/cm$^2$; and
   performing a bulk fill plating operation at a forward current density between 30 and 80 mA/cm$^2$.

2. The method of claim 1, wherein the first plating operation comprises a first sub-step at a first current density and a second sub-step at a second current density; wherein the second current density is greater than the first current density.

3. The method of claim 1, further comprising maintaining a period without applying voltage to the wafer between the first plating operation and the second plating operation.

4. The method of claim 1, further comprising performing a third plating operation at a forward current density between 15 and 60 mA/cm$^2$; and a fourth plating operation at a reverse current density between 15 and 60 mA/cm$^2$.

5. The method of claim 4, wherein the first plating operation comprises a first sub-step at a first current density and a second sub-step at a second current density; wherein the second current density is greater than the first current density.

6. The method of claim 5, further comprising maintaining a period without applying voltage to the wafer between the first plating operation and the second plating operation.

7. The method of claim 1, wherein performing the first plating operation, the second plating operation and the bulk fill operation, each comprise forcing a current in the plating solution between the wafer and at least one electrode disposed in the plating solution.

8. The method of claim 7, wherein subsequent to the first plating operation and the second plating operation, and prior to the second plating operation, forcing of currents is stopped for a predetermined length of time.

9. The method of claim 8, wherein the predetermined length of time is approximately one second.

10. A method of electroplating copper, comprising:
    immersing a wafer into a plating bath having a electrode therein;
    applying a first voltage between the electrode and the wafer to produce a first forward current;
    applying a second voltage between the electrode and the wafer to produce a second forward current;
    applying a third voltage between the electrode and the wafer to produce a third forward current;
    applying a fourth voltage between the electrode and the wafer to produce a first reverse current;
    applying a fifth voltage between the electrode and the wafer to produce a fourth forward current;
    applying a sixth voltage between the electrode and the wafer to produce a second reverse current; and
    applying a seventh voltage between the electrode and the wafer to produce a fifth forward current.

11. The method of claim 10, wherein the second voltage is greater than the first voltage, and the third voltage is greater than the second voltage.

12. The method of claim 11, wherein the fifth voltage is greater than the third voltage, and the seventh voltage is greater than the fifth voltage.

13. The method of claim 10, wherein the fourth and sixth voltages are nominally the same voltage.

14. The method of claim 12, further comprising, subsequent to applying the third voltage, removing the voltage between the electrode and the wafer.

15. The method of claim 12, further comprising, subsequent to applying the fourth voltage, removing the voltage between the electrode and the wafer.

16. The method of claim 12, further comprising:
    subsequent to applying the third voltage and prior to applying the fourth voltage, removing the voltage between the electrode and the wafer;
    subsequent to applying the fourth voltage and prior to applying the fifth voltage, removing the voltage between the electrode and the wafer;
    subsequent to applying the fifth voltage and prior to applying the sixth voltage, removing the voltage between the electrode and the wafer; and
    subsequent to applying the sixth voltage and prior to applying the seventh voltage, removing the voltage between the electrode and the wafer.

17. The method of claim 16, wherein the first, second, third, and fourth forward currents have a current density of between 10 and 30 mA/cm$^2$.

18. The method of claim 17, wherein the first and second reverse currents have a current density of between 15 and 60 mA/cm$^2$.

19. The method of claim 17, wherein a final forward current has a current density of between 30 and 80 mA/cm$^2$.

20. The method of claim 19, wherein the final forward current results from applying the seventh voltage.

21. A method of electroplating a metal layer over a seed layer on a wafer, comprising:
    placing the wafer in a plating solution having at least one electrode disposed therein;
    performing a plurality of low current plating and low current de-plating operations, followed by a higher current bulk fill operation;
    wherein the low current plating operations comprise forcing a forward current density of between 10 and 30 mA/cm$^2$, the low current de-plating operations comprise forcing a reverse current density of between 15 and 60 mA/cm$^2$, and the bulk fill operation comprises forcing a forward current density of between 30 and 80 mA/cm$^2$.

22. The method of claim 21, wherein the metal comprises Cu, CuSn, CuMg, CuNi, CuZn, CuPd, CuAu, CuRe and CW.

23. The method of claim 22, wherein the low current plating operations have a duration of between 2 and 60 seconds.

24. The method of claim 23, further comprising forcing zero current between the wafer and the electrode subsequent to a low current plating operation and prior to a low current de-plating operation.

25. The method of claim 24, wherein forcing zero current comprises forcing zero current for approximately 1 second.

26. The method of claim 22, wherein a first one of the plurality of low current plating operations includes three sub-steps with each sub-step characterized by forcing a different current density.

27. The method of claim 26, wherein the different current densities are monotonically increasing.

28. The method of claim 27, wherein the first of the three sub-steps repairs a seed layer.

29. The method of claim 28, wherein the second and third of the three sub-steps fill at least one opening in the wafer, the opening having a lateral width of less than 0.3 microns.

30. The method of claim 24, wherein the low current de-plating operations remove at least one adsorbed chemical from the surface of the wafer.

31. The method of claim 30, wherein the at least one adsorbed chemical is mercaptopropansulfonate.

* * * * *